(12) United States Patent
Fowler

(10) Patent No.: US 8,924,609 B2
(45) Date of Patent: Dec. 30, 2014

(54) RECONFIGURABLE MODULAR COMPUTING DEVICE

(71) Applicant: Entegra Technologies, Inc., Plano, TX (US)

(72) Inventor: Douglas Lee Fowler, Frisco, TX (US)

(73) Assignee: Entegra Technologies, Inc., Plano, TX (US)

(*) Notice: Subject to any disclaimer, the term of this patent is extended or adjusted under 35 U.S.C. 154(b) by 0 days.

(21) Appl. No.: 14/263,742

(22) Filed: Apr. 28, 2014

(65) Prior Publication Data

US 2014/0229650 A1 Aug. 14, 2014

Related U.S. Application Data

(63) Continuation of application No. 13/794,190, filed on Mar. 11, 2013, now Pat. No. 8,751,710.

(60) Provisional application No. 61/644,243, filed on May 8, 2012, provisional application No. 61/711,878, filed on Oct. 10, 2012, provisional application No. 61/774,916, filed on Mar. 8, 2013.

(51) Int. Cl.
*G06F 3/00* (2006.01)
*G06F 13/40* (2006.01)
*G06F 1/16* (2006.01)
*H05K 3/32* (2006.01)
*H05K 13/04* (2006.01)

(52) U.S. Cl.
CPC .......... *G06F 13/4081* (2013.01); *G06F 1/1684* (2013.01); *H05K 3/32* (2013.01); *H05K 13/04* (2013.01)
USPC ................................................ 710/72; 710/8

(58) Field of Classification Search
None
See application file for complete search history.

(56) References Cited

U.S. PATENT DOCUMENTS

| 5,559,675 A | 9/1996 | Hsieh et al. |
| 5,753,982 A | 5/1998 | Yeh |

(Continued)

FOREIGN PATENT DOCUMENTS

| CN | 1355456 A | 6/2002 |
| CN | 1584604 A | 2/2005 |

(Continued)

OTHER PUBLICATIONS

Filing receipt and specification for provisional patent application entitled "Ultra Modular Device (UMD)," by Douglas Lee Fowler, filed May 8, 2012 as U.S. Appl. No. 61/644,243.

(Continued)

*Primary Examiner* — Cheng-Yuan Tseng
(74) *Attorney, Agent, or Firm* — Conley Rose, P.C.; Rodney B. Carroll

(57) ABSTRACT

A configurable computing device comprising a housing, a printed circuit board disposed within the housing, a first microcontroller and a second microcontroller each coupled to the PCB, wherein the first microcontroller and the second microcontroller are in electrical signal communication with each other, a computer-on-module (COM) coupled to the PCB, wherein the COM is in electrical signal communication with the first microcontroller and the second microcontroller, and one or more peripheral modules coupled to the PCB, wherein the peripheral modules are each in electrical signal communication with the first microcontroller and wherein, the peripheral modules are each in electrical signal communication with the COM via the second microcontroller.

20 Claims, 8 Drawing Sheets

(56) References Cited

U.S. PATENT DOCUMENTS

| | | | |
|---|---|---|---|
| 5,852,743 A | 12/1998 | Yeh | |
| 5,877,628 A | 3/1999 | Yeh | |
| 5,889,513 A | 3/1999 | Yeh | |
| 5,905,365 A | 5/1999 | Yeh | |
| 5,962,936 A | 10/1999 | Yeh | |
| 6,023,587 A * | 2/2000 | Watts et al. | 710/72 |
| 6,049,193 A | 4/2000 | Chien | |
| 6,069,448 A | 5/2000 | Yeh | |
| 6,082,623 A | 7/2000 | Chang | |
| 6,101,087 A | 8/2000 | Sutton et al. | |
| 6,106,566 A | 8/2000 | Klein | |
| 6,252,768 B1 | 6/2001 | Lin | |
| 6,259,589 B1 | 7/2001 | Chao | |
| 6,424,522 B1 | 7/2002 | Lin et al. | |
| 6,469,742 B1 | 10/2002 | Trovato et al. | |
| 6,504,710 B2 | 1/2003 | Sutton et al. | |
| 6,516,373 B1 | 2/2003 | Talbot et al. | |
| 6,802,016 B2 | 10/2004 | Liu | |
| 6,898,740 B2 * | 5/2005 | Olarig | 714/43 |
| 6,906,901 B1 | 6/2005 | Liu | |
| 6,965,208 B2 | 11/2005 | Chen | |
| 7,171,546 B2 | 1/2007 | Adams | |
| 7,262,963 B2 | 8/2007 | Yu et al. | |
| 7,475,806 B1 | 1/2009 | Crossno et al. | |
| 7,526,597 B2 | 4/2009 | Perego et al. | |
| 7,580,256 B2 | 8/2009 | Liao | |
| D601,557 S | 10/2009 | Wesolek | |
| 7,610,366 B2 | 10/2009 | Wilson, Jr. | |
| 7,610,475 B2 | 10/2009 | Arnold et al. | |
| 7,765,390 B2 | 7/2010 | Kao | |
| 7,809,960 B2 | 10/2010 | Einloth et al. | |
| 7,836,237 B2 | 11/2010 | Lien et al. | |
| 7,851,710 B2 | 12/2010 | Liao | |
| D635,568 S | 4/2011 | Wesolek | |
| D638,834 S | 5/2011 | Wesolek | |
| 7,940,173 B2 | 5/2011 | Koen | |
| 8,024,722 B2 | 9/2011 | Lim et al. | |
| 8,036,399 B2 | 10/2011 | Chao et al. | |
| D654,499 S | 2/2012 | Wesolek | |
| D662,502 S | 6/2012 | Wesolek | |
| D668,657 S | 10/2012 | Wesolek | |
| D671,118 S | 11/2012 | Wesolek | |
| 8,310,351 B2 | 11/2012 | Krahenbuhl et al. | |
| D678,935 S | 3/2013 | Wesolek | |
| 8,417,774 B2 | 4/2013 | Flynn et al. | |
| D688,240 S | 8/2013 | Wesolek | |
| 8,516,414 B2 | 8/2013 | Kato et al. | |
| D690,296 S | 9/2013 | Wesolek | |
| 8,526,354 B2 | 9/2013 | Ishizu et al. | |
| D692,893 S | 11/2013 | Wesolek | |
| 8,577,294 B2 | 11/2013 | Causey et al. | |
| 2002/0008498 A1 | 1/2002 | Tong | |
| 2002/0059443 A1 | 5/2002 | Mu | |
| 2002/0066046 A1 | 5/2002 | Liu | |
| 2005/0144528 A1 | 6/2005 | Bucher et al. | |
| 2006/0041854 A1 | 2/2006 | Schlanger et al. | |
| 2006/0136606 A1 * | 6/2006 | Guzy et al. | 710/1 |
| 2006/0256079 A1 | 11/2006 | Wu | |
| 2006/0256511 A1 | 11/2006 | Ma | |
| 2006/0256513 A1 | 11/2006 | Yeh et al. | |
| 2006/0256514 A1 | 11/2006 | Wang | |
| 2007/0060310 A1 | 3/2007 | Juds et al. | |
| 2007/0067535 A1 | 3/2007 | Liu | |
| 2007/0129044 A1 | 6/2007 | Chen | |
| 2007/0152889 A1 | 7/2007 | Chen et al. | |
| 2007/0155356 A1 | 7/2007 | Chang | |
| 2007/0159714 A1 | 7/2007 | Kao et al. | |
| 2007/0235169 A1 | 10/2007 | Chen | |
| 2007/0296708 A1 | 12/2007 | Lu | |
| 2008/0007456 A1 | 1/2008 | Chen et al. | |
| 2008/0049409 A1 | 2/2008 | Chen et al. | |
| 2008/0125872 A1 | 5/2008 | Chen | |
| 2008/0144540 A1 | 6/2008 | Chang et al. | |
| 2009/0109068 A1 | 4/2009 | Yeh et al. | |
| 2009/0251108 A1 | 10/2009 | Chao et al. | |
| 2010/0004936 A1 | 1/2010 | Chao | |
| 2010/0253508 A1 | 10/2010 | Koen et al. | |
| 2011/0066832 A1 | 3/2011 | Casselman et al. | |
| 2012/0051262 A1 | 3/2012 | Clark et al. | |
| 2013/0169214 A1 | 7/2013 | Tseng | |
| 2014/0008427 A1 | 1/2014 | Wesolek | |

FOREIGN PATENT DOCUMENTS

| | | |
|---|---|---|
| CN | 1760926 A | 4/2006 |
| CN | 2852259 Y | 12/2006 |
| CN | 2862146 Y | 1/2007 |
| CN | 2862148 Y | 1/2007 |
| CN | 2862149 Y | 1/2007 |
| CN | 2862472 Y | 1/2007 |
| CN | 2886633 Y | 4/2007 |
| CN | 2886634 Y | 4/2007 |
| CN | 2906715 Y | 5/2007 |
| CN | 2932558 Y | 8/2007 |
| CN | 2932837 Y | 8/2007 |
| CN | 201000589 Y | 1/2008 |
| CN | 201000592 Y | 1/2008 |
| CN | 101137284 A | 3/2008 |
| CN | 201066470 Y | 5/2008 |
| CN | 101207494 A | 6/2008 |
| CN | 101424989 A | 5/2009 |
| CN | 101598958 A | 12/2009 |
| CN | 101621280 A | 1/2010 |
| CN | 101782798 A | 7/2010 |
| CN | 103187752 A | 7/2013 |
| CN | 103530589 A | 1/2014 |
| DE | 29712774 U1 | 9/1997 |
| DE | 19731013 A1 | 3/1999 |
| DE | 29724425 U1 | 2/2001 |
| DE | 102006029855 A1 | 3/2007 |
| EP | 2354937 A2 | 8/2011 |
| GB | 2459092 A | 10/2009 |
| JP | 2002040995 A | 2/2002 |
| JP | 2002149261 A | 5/2002 |
| KR | 20020082377 A | 10/2002 |
| TW | 384464 B | 3/2000 |
| TW | 388177 B | 4/2000 |
| TW | 389854 B | 5/2000 |
| TW | 403866 B | 9/2000 |
| TW | 411651 B | 11/2000 |
| TW | 413750 B | 12/2000 |
| TW | 416206 B | 12/2000 |
| TW | 424174 B | 3/2001 |
| TW | 424343 B | 3/2001 |
| TW | 445614 B | 7/2001 |
| TW | 548540 B | 8/2003 |
| TW | 573394 B | 1/2004 |
| TW | M281227 U | 11/2005 |
| TW | M281263 U | 11/2005 |
| TW | M286391 U | 1/2006 |
| TW | M286396 U | 1/2006 |
| TW | M286420 U | 1/2006 |
| TW | M286509 U | 1/2006 |
| TW | M287958 U | 2/2006 |
| TW | M294728 U | 7/2006 |
| TW | I259975 B | 8/2006 |
| TW | M296512 U | 8/2006 |
| TW | M309133 U | 4/2007 |
| TW | M309181 U | 4/2007 |
| TW | M329951 U | 4/2008 |
| TW | M330730 U | 4/2008 |
| TW | 201027433 A | 7/2010 |
| WO | 2013169487 A1 | 11/2013 |

OTHER PUBLICATIONS

Filing receipt and specification for provisional patent application entitled "odem™ cross-fire™," by Douglas Lee Fowler, filed Oct. 10, 2012 as U.S. Appl. No. 61/711,878.

(56) References Cited

OTHER PUBLICATIONS

Filing receipt and specification for provisional patent application entitled "Crossbow™ Tablet Computer System," filed Mar. 8, 2013 as U.S. Appl. No. 61/774,916.

Foreign communication from a related counterpart application—International Search Report and Written Opinion, PCT/US2013/038028, Aug. 23, 2013, 15 pages.

* cited by examiner

RECONFIGURABLE MODULAR COMPUTING DEVICE

CROSS-REFERENCE TO RELATED APPLICATIONS

This application is a continuation of and claims priority to U.S. patent application Ser. No. 13/794,190 filed on Mar. 11, 2013, published as US 2013/0301202A1 and entitled "Reconfigurable Modular Computing Device," which claims priority to U.S. Provisional Application Nos. 61/644,243 filed May 8, 2012 and entitled "Ultra Modular Device (UMD)," 61/711,878 filed Oct. 10, 2012 and entitled "Odem™ Cross-Fire™," and 61/774,916 filed Mar. 8, 2013 and entitled "Crossbow™ Tablet Computer System," all of which are incorporated herein by reference in their entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A computing device may generally comprise a plurality of functional units, peripheral connections, and user interfaces, for example, one or more memory storage devices, microprocessors, audio/video processors, display screens, input/output ports, etc. As such, conventional computing device may have a preconfigured set of functional units, peripheral connections, and user interfaces for a given application. For example, the computing device may be configured for meeting computing performance metrics, for harsh elemental environments, for extreme temperatures, for portability, for integration, for high security, and/or for any other application. Conventional computing devices, systems, and configurations are insufficient to provide the ability to accommodate for a broad range of applications with a single computing device. As such, devices, systems, and methods for allowing a computing device to be employed in a broad range of applications are needed.

SUMMARY

In one aspect, the disclosure includes a configurable computing device comprising a housing, a printed circuit board disposed within the housing, a first microcontroller and a second microcontroller each coupled to the PCB, wherein the first microcontroller and the second microcontroller are in electrical signal communication with each other, a computer-on-module (COM) coupled to the PCB, wherein the COM is in electrical signal communication with the first microcontroller and the second microcontroller, and one or more peripheral modules coupled to the PCB, wherein, the peripheral modules are each in electrical signal communication with the first microcontroller and wherein, the peripheral modules are each in electrical signal communication with the COM via the second microcontroller.

In another aspect this disclosure includes a computing device method comprising the steps of providing a printed circuit board (PCB) comprising a first microcontroller and a second microcontroller, wherein the first microcontroller and the second microcontroller are in electrical signal communication with each other, installing a computer-on-module (COM) to the PCB, wherein the COM is electrically coupled to the PCB, interrogating the COM, thereby determining a COM profile, installing one or more peripheral modules to the PCB, wherein the peripherals are each electrically coupled to the PCB, interrogating the peripheral modules, thereby determining a peripheral module profile, configuring the second microcontroller, wherein, the second microcontroller is configured dependent on the COM profile and the peripheral module profile and provides one or more electrical signal flow paths between the COM and the peripheral modules, and communicating an electrical signal between the COM and the peripheral modules via the second microcontroller.

BRIEF DESCRIPTION OF THE DRAWINGS

For a more complete understanding of the present disclosure and the advantages thereof, reference is now made to the following brief description, taken in connection with the accompanying drawings and detailed description.

DETAILED DESCRIPTION OF THE EMBODIMENTS

Figure 1:
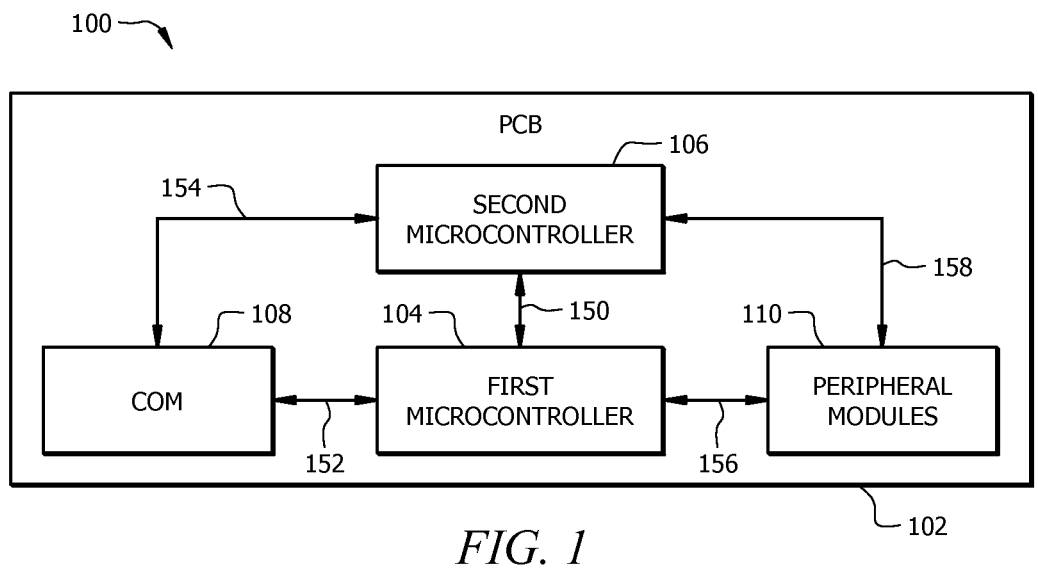
FIG. 1 is a schematic diagram of an embodiment of a configurable computing device.

In the drawings and description that follow, like parts are typically marked throughout the specification and drawings with the same reference numerals, respectively. In addition, similar reference numerals may refer to similar components in different embodiments disclosed herein. The drawing figures are not necessarily to scale. Certain features of the invention may be shown exaggerated in scale or in somewhat schematic form and some details of conventional elements may not be shown in the interest of clarity and conciseness. The present invention is susceptible to embodiments of different forms. Specific embodiments are described in detail and are shown in the drawings, with the understanding that the present disclosure is not intended to limit the invention to the embodiments illustrated and described herein. It is to be fully recognized that the different teachings of the embodiments discussed herein may be employed separately or in any suitable combination to produce desired results.

Unless otherwise specified, use of the terms "connect," "engage," "couple," "attach," or any other like term describing an interaction between elements is not meant to limit the interaction to direct interaction between the elements and may also include indirect interaction between the elements described.

Disclosed herein are embodiments of a reconfigurable modular computing device (RMCD) and methods of using the same. In an embodiment, a RMCD may be utilized to allow a user to configure and/or to reconfigure the RMCD for one or more applications, as needed, thereby providing the ability to configure the RMCD for a variety of applications. For example, the RMCD may be configured for a first application (e.g., comprising a first set of functional units, peripheral connections, and user interfaces) and then may be reconfigured for a second application (e.g., comprising a second set of functional units, peripheral connections, and user interfaces), thereby providing the ability to adapt the RMCD for a given application.

The RMCD may comprise a plurality of functional units. In an embodiment, a functional unit (e.g., an integrated circuit (IC)) may perform a single function, for example, serving as an amplifier or a buffer. Additionally or alternatively, the functional unit may perform multiple functions on a single chip. In an embodiment, the functional unit may comprise a group of components (e.g., transistors, resistors, capacitors, diodes, and/or inductors) on an IC which may perform a defined function. The functional unit may comprise a specific set of inputs, a specific set of outputs, and an interface (e.g., an electrical interface, a logic interface, and/or other interfaces) with other functional units of the IC and/or with external components. In some embodiments, the functional unit may comprise repeat instances of a single function (e.g., multiple flip-flops or adders on a single chip) or may comprise two or more different types of functional units which may together provide the functional unit with its overall functionality. For example, a microprocessor may comprise functional units such as an arithmetic logic unit (ALU), one or more floating-point units (FPU), one or more load or store units, one or more branch prediction units, one or more memory controllers, and other such modules. In some embodiments, the functional unit may be further subdivided into component functional units. For example, a microprocessor as a whole may be viewed as a functional unit of an IC, for example, if the microprocessor shares a circuit with at least one other functional unit (e.g., a cache memory unit).

The functional unit may comprise, for example, a general purpose processor, a mathematical processor, a state machine, a digital signal processor, a video processor, an audio processor, a logic unit, a logic element, a multiplexer, a demultiplexer, a switching unit, a switching element an input/output (I/O) element, a peripheral controller, a bus, a bus controller, a register, a combinatorial logic element, a storage unit, a programmable logic device, a memory unit, a neural network, a sensing circuit, a control circuit, a digital to analog converter (DAC), an analog to digital converter (ADC), an oscillator, a memory, a filter, an amplifier, a mixer, a modulator, a demodulator, and/or any other suitable devices as would be appreciated by one of ordinary skill in the art.

Referring to the embodiment of FIG. 1, a RMCD 100 may comprise a plurality of distributed components and/or functional units such that each functional unit may communicate with another functional unit via a suitable signal conduit, for example, via one or more electrical connections, as will be disclosed herein. For example, the RMCD 100 may generally comprise a printed circuit board (PCB) 102, a first microcontroller 104, a second microcontroller 106, a computer-on-module (COM) or system-on-module (SOM) 108, and one or more embedded or peripheral modules 110.

In an embodiment, the PCB 102 may be configured to provide physical and electrical connectivity between one or more functional units, for example, between one or more microcontrollers, between one or more peripheral modules, between a microcontroller and one or more peripheral modules, etc. The PCB 102 may generally comprise a non-conductive substrate having a plurality of conductive flow paths, tracks, traces, or the like, and thereby provides a plurality of routes for electrical signal communication. In an embodiment, the PCB 102 may comprise a plurality of preconfigured electrical signal flow paths (e.g., one or more conductive electrical signal flow paths etched onto the PCB 102) and a plurality of configurable electrical signal flow paths (e.g., one or more electronically switchable electrical signal flow paths, for example, via one or more transistors, microprocessors, etc.), as will be disclosed herein.

In an embodiment, the first microcontroller 104 and/or the second microcontroller 106 may be a peripheral interface controller (PIC), a field programmable gate array (FPGA), or an embedded processor and may generally comprise an ALU, one or more data registers, an ADC, one or more memory devices, a plurality of input/output (I/O) ports, a matrix switch, one or more signal conditioners or adapters, any other suitable functional unit as would be appreciated by one of ordinary skill in the art upon viewing this disclosure, or combination thereof. The first microcontroller 104 and/or the second microcontroller 106 may be configured to selectively provide one or more electrical signal flow paths, for example, via one or more I/O ports. In an embodiment, the first microcontroller 104 and/or the second microcontroller 106 may be configured to communicate an electrical signal to a plurality of I/O ports (e.g., a controller area network (CAN) bus, an Inter-Integrated Circuit ($I^2C$) bus, a Universal Serial Bus (USB), a low pin count (LPC) bus, a Universal Asynchronous Receiver/Transmitter (UART) bus, a low voltage differential signaling (LVDS) bus, etc.) and to employ any suitable signaling protocol as would be appreciated by one of ordinary skill in the art upon viewing this disclosure. For example, the first microcontroller 104 and/or the second microcontroller 106 may comprise a memory device having instructions to allow and/or to disallow one or more electrical signal flow paths (e.g., via one or more I/O ports) in response to a data signal (e.g., a device profile), as will be disclosed herein.

In an embodiment, the first microcontroller 104 and the second microcontroller 106 each comprise an electronic circuit configured to perform logical and/or arithmetic operations. Additionally, the first microcontroller 104 and/or the second microcontroller 106 may further comprise a memory storage device (e.g., an electrically erasable programmable read-only memory (EEPROM), an erasable programmable read-only memory (EPROM), a read-only memory (ROM), etc.) having a system basic input/output system (BIOS), a board support package (BSP), an operating system, a look-up table, a firmware, a driver, data instructions, or the like programmed onto the first microcontroller 104 and/or the second microcontroller 106, for example, for the purpose of performing one or more operations (e.g., detecting hardware, configuring I/O ports, performing an authentication, performing a verification, etc.). For example, the first microcontroller 104 may comprise a memory having start-up instructions, such as, reading a temperature sensor, initializing general purpose input/output (GPIO) ports, and enabling power flow (e.g., to a COM, one or more peripheral devices, etc.).

Additionally, the first microcontroller 104 and the second microcontroller 106 are configured to control the flow of data through the RMCD 100 and/or to coordinate the activities of one or more functional units of the RMCD 100. For example, the first microcontroller 104 and/or the second microcontroller 106 may be in electrical signal communication with and/or configured to control signal communications (e.g., data transmission) between the first microcontroller 104, the second microcontroller 106, the COM 108, the peripheral modules 110, any other suitable functional units, or combinations thereof. In an embodiment, the second microcontroller 106 may comprise a memory having a plurality of predefined I/O port configurations for a particular device (e.g., a COM, a peripheral module, etc.) and, thereby allowing the second microcontroller 106 to configure, monitor, police, etc. electrical signal communication via the second microcontroller 106.

In the embodiment of FIG. 1, the first microcontroller 104 is in electrical signal communication with the second microcontroller 106 (e.g., via electrical connection 150), the COM 108 (e.g., via electrical connection 152), the peripheral modules 110 (e.g., via electrical connection 156). Additionally, the second microcontroller 106 is in electrical signal communication with the COM 108 (e.g., via electrical connection 154) and the peripheral modules 110 (e.g., via electrical connection 158). Further, the RMCD 100 (e.g., first microcontroller 104 and/or the second microcontroller 106) may comprise a power management system, for example, comprising one or more voltage regulators, power distribution networks, voltage level converters, voltage rectifiers, etc. Additionally, the RMCD 100 may be supplied with electrical power via a power source, for example, via an on-board battery, an alternating current (AC) power supply, a direct current (DC) power supply, etc. For example, the RMCD 100 may be supplied power via a 12 volt wall adapter power supply.

Additionally, the first microcontroller 104 and/or the second microcontroller 106 may be configured to be removably coupled to the PCB 102. In such an embodiment, the first microcontroller 104 and/or the second microcontroller 106 may each be added to or removed from the PCB 102, for example, for programming purposes, as needed. For example, the first microcontroller 104 and/or the second microcontroller 106 may be coupled to a carrier board or baseboard having a peripheral connection bus (e.g., a plug-and-play device, a PCB comprising a plurality of electrical pins or contacts, etc.) and may be configured to couple with the PCB 102 via mating the peripheral connection bus of the first microcontroller 104 and/or the second microcontroller 106 to a suitable peripheral connection bus receiver on the PCB 102. In an embodiment, the first microcontroller 104 is a PIC24 family microcontroller. Additionally, the second microcontroller 106 is a Texas Instruments MSP430 family microcontroller. Alternatively, the first microcontroller 104 and/or the second microcontroller 106 may be any other suitable microcontroller as would be appreciated by one of ordinary skill in the art upon viewing this disclosure.

In an embodiment, the COM 108 may be configured to be removably coupled to the PCB 102. For example, the COM 108 may be added to or removed from the PCB 102, for example, for the purpose of configuring or reconfiguring the RMCD 100 for a given application. For example, the COM 108 may comprise a carrier board or baseboard having a peripheral connection bus (e.g., a Qseven module, an ITX, a PC-104, a COM express module, a plug-and-play device, a custom PCB comprising a plurality of electrical pins or contacts, etc.) and may be configured to couple with the PCB 102 via mating the peripheral connection bus of the COM 108 to a suitable peripheral connection bus receiver on the PCB 102.

In an embodiment, the COM 108 may generally comprise a central processing unit (CPU) or system-on-chip (SOC) (e.g., Intel Atom series, Freescale series, Texas Instruments OMAP series, etc.), a hub controller, a power management module, a memory device (e.g., a random access memory (RAM), a read only memory (ROM), a flash memory, a cache, etc.), a plurality of I/O ports (e.g., a PCIe bus, a CAN bus, an I²C bus, a USB, a LPC bus, a UART bus, a LVDS bus, a DisplayPort, etc.), an audio processor, a video processor, a multi-band radio module, any other suitable functional unit, or combination thereof. The COM 108 may be configured to support and/or to execute one or more instruction sets, for example, an X86 instruction set (e.g., an x86 platform) or BIOS, an ARM instruction set (e.g., an ARM platform) or BSP, etc. Additionally, the COM 108 may be configured to support and/to execute one or more operating systems (OS), for example, a Windows-based OS, a Linux-based OS, an Android-based OS, or the like. In an embodiment, the COM 108 is an x86 platform CPU. In an alternative embodiment, the COM 108 is an ARM platform CPU. Additionally, in an embodiment, the COM 108 is integrated onto a Qseven module or board.

In an embodiment, the one or more peripheral modules 110 may be configured to be removably coupled to the PCB 102. For example, in an embodiment, the one or more peripheral modules 110 may be added to or removed from the PCB 102, for example, for the purpose of configuring or reconfiguring the RMCD 100 for a given application. For example, the peripheral modules 110 may each comprise a carrier board or baseboard having a peripheral connection bus (e.g., a plug-and-play device, a PCB comprising a plurality of electrical pins or contacts, etc.) and may be configured to couple with the PCB 102 via mating the peripheral connection bus of the peripheral module 110 to a suitable peripheral connection bus receiver on the PCB 102.

In an embodiment, the peripheral modules 110 may be generally configured to provide increased functionality to the RMCD 100. For example, the peripheral modules 110 may comprise a display module, for example, a liquid crystal display (LCD), a light emitting diode (LED) display, an organic light emitting diode (OLED) display, an active-matrix organic light emitting diode (AMOLED) display, a color super twisted nematic (CSTN) display, a thin film transistor (TFT) display, a thin film diode (TFD) display, and/or any other suitable type of display as would be appreciated by one of ordinary skill in the art upon viewing this disclosure. Additionally or alternatively, the peripheral modules 110 may comprise one or more user interfaces, for example, a capacitive touchscreen, a resistive touchscreen, an inductive digitizer, a key pad, a mouse pad, a track ball, one or more buttons, any other suitable human input devices as would be appreciated by one of ordinary skill in the art upon viewing this disclosure, or combinations thereof. Additionally or alternatively, the peripheral modules 110 may comprise one or more sensors or cameras, for example, a CMOS imager module, a barcode module, a near field card reader module, a magnetic card reader module, a radio frequency identification (RFID) module, a biometric sensor module, a light detector module, a camera flash module, a global position system (GPS) module, a bedside monitor module, an accelerometer module, a gyroscope module, and/or any other suitable type of sensor or camera module as would be appreciated by one of ordinary skill in the art upon viewing this disclosure. Additionally or alternatively, the peripheral modules 110 may comprise one or more audio modules, for example, a speaker or a microphone. Additionally or alternatively, the peripheral modules 110 may comprise one or more communications or connectivity modules, for example, an ethernet module, a WiFi module, a radio module, a cellular radio module, an antenna, a multi-band antenna, a Bluetooth module, an infrared module, near filed communications module (NFC), and/or any other suitable type of communications or connectivity module as would be appreciated by one of ordinary skill in the art upon viewing this disclosure. Additionally or alternatively, the peripheral modules 110 may comprise one or more I/O connection modules, for example, an HDMI module, a RS-223 module, a USB module, a DVI module, a VGA module, an S-video module, a docking port interface module, and/or any other suitable type of I/O connection module. Additionally or alternatively, the peripheral modules 110 may comprise a power supply module, for example, a battery pack module. Additionally or alternatively, the peripheral modules 110 may comprise one or more military or security modules, for example, a common access card (CAC) reader module, a secure radio modem module, a selective availability GPS module, an encryption/decryption module, a SAASM/TacLink expansion module (STEM), and/or any other suitable military module. For example, in an embodiment, the peripheral modules 110 may comprise a STEM module comprising a military microgram GPS receiver with an embedded antenna and a secure TacLink 3300 data modem. Additionally or alternatively, the peripheral modules 110 may comprise any other suitable type and/or configuration of peripheral modules as would be appreciated by one of ordinary skill in the art upon viewing this disclosure.

The one or more peripheral modules 110 may be configured to communicate with the first microcontroller 104 and/or the second microcontroller 106 via any suitable electrical signal protocol (e.g., a protocol defined by the Institute of Electrical and Electronics Engineers (IEEE)) as would be appreciated by one of ordinary skill in the art upon viewing this disclosure.

Figure 2:
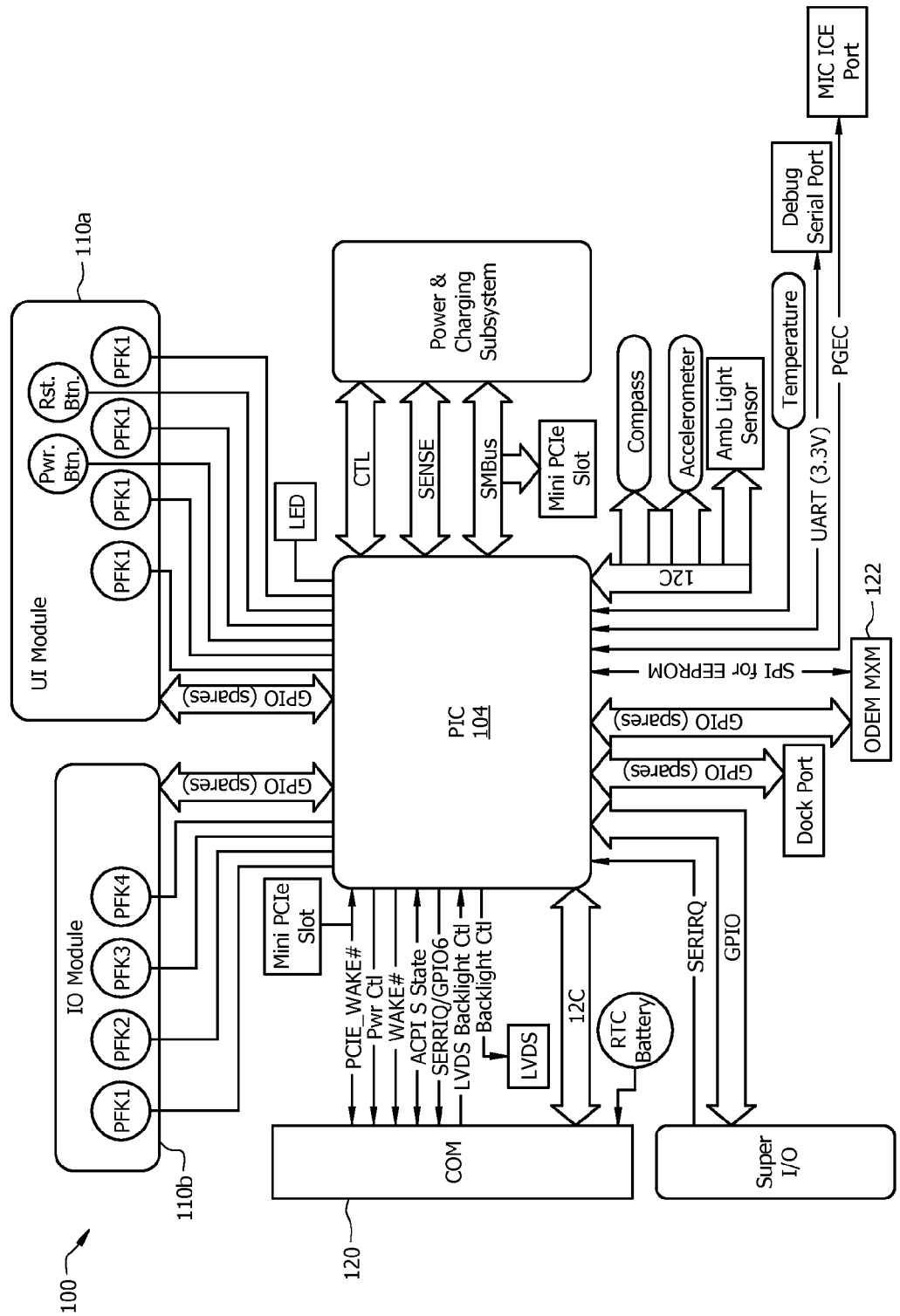
FIG. 2 is a partial block diagram of embodiment of a configurable computing device.
Figure 3:
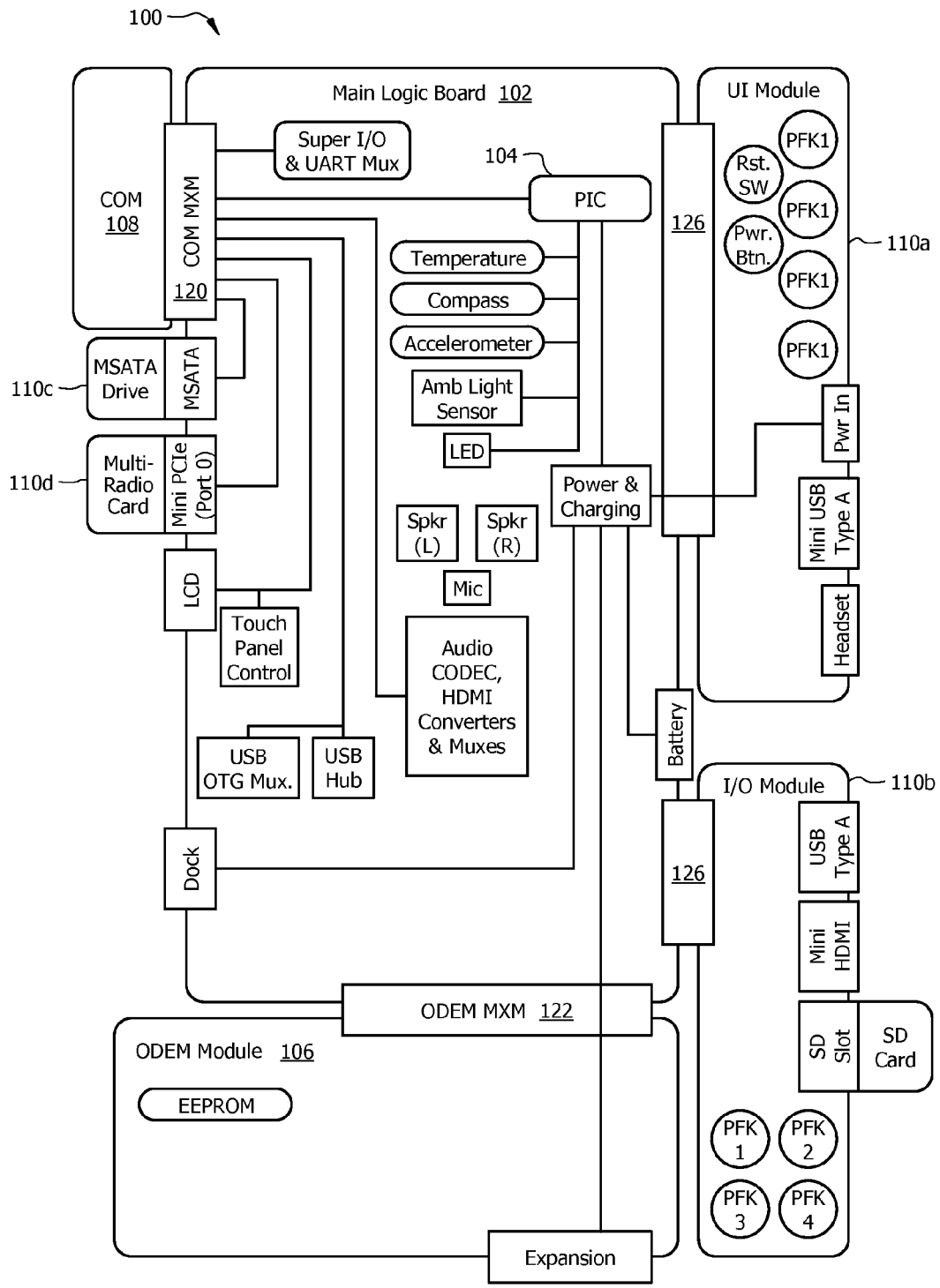
FIG. 3 is a block diagram of an embodiment of a configurable computing device.

Referring to FIGS. 2-3, an embodiment of the RMCD 100 is illustrated. In such an embodiment, the first microcontroller 104 is a peripheral interface controller (PIC) and is integrated with the PCB 102 (e.g., shown as a main logic board (MLB)) and in electrical communication with a plurality of on-board devices and peripheral connections associated with the PCB 102 (e.g., sensors, I/O ports, etc.). For example, in the embodiment of FIG. 2, the first microcontroller 104 is in electrical signal communication with a plurality of connection buses (e.g., a COM connection bus 120, an on-demand expansion module (ODEM) connection bus 122, super I/O bus, etc.), sensors (e.g., compass, accelerometer, thermometer, etc.), I/O ports (e.g., a CAN bus, an I$^2$C bus, a USB, a LPC bus, a UART bus, etc.), peripheral modules (e.g., user interface module 110a, I/O module 110b, etc.), and any other component or device associated with the PCB 102. Referring to FIG. 3, the second microcontroller 106, shown as ODEM module, is coupled to a carrier board having a peripheral connection bus (e.g., a plug-and-play device, a custom PCB comprising a plurality of electrical pins or contacts, etc.) and is coupled with the PCB 102 (e.g., MLB) via the peripheral connection bus receiver (e.g., the ODEM connection bus 122). The COM 108 may comprise a carrier board having a peripheral connection bus (e.g., a Qseven module, a plug-and-play device, a PCB comprising a plurality of electrical pins or contacts, etc.) and is coupled with the PCB 102 via the peripheral connection bus receiver (e.g., connection bus 120). Further, the PCB 102 is coupled to a plurality of peripheral modules. For example, the PCB 102 is coupled to a user interface (UI) module 110a having a plurality of buttons (e.g., a reset button, a power button, etc.) and I/O ports (e.g., a power terminal, a USB port, a headphone jack, etc.) via a connection bus 126, a I/O module 110b having a plurality of buttons and a I/O ports (e.g., a USB port, an HDMI port, a memory port, etc.), a radio module 110d (e.g., a multi-radio card), and a memory module 110c (e.g., a Mini-SATA).

Figure 4:
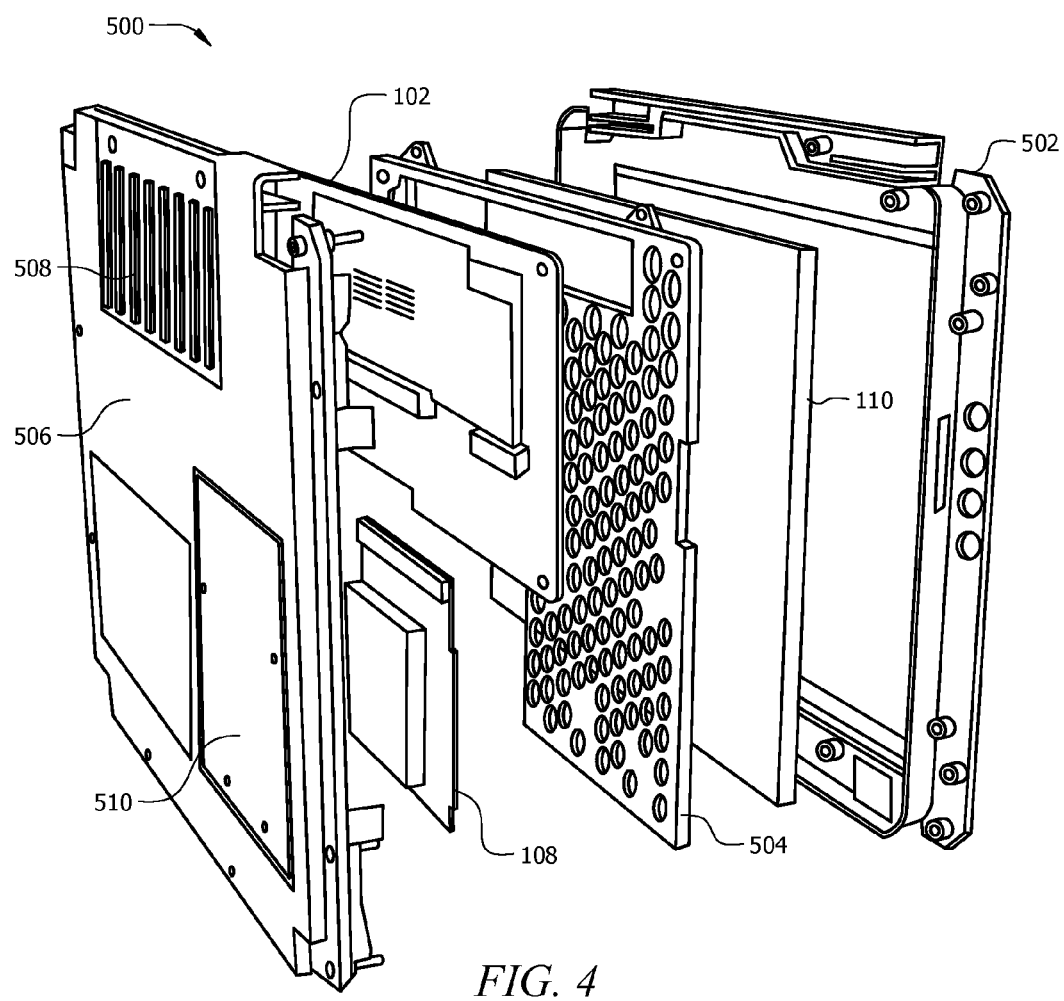
FIG. 4 is an rear-side perspective exploded view of an embodiment of a housing.
Figure 5:
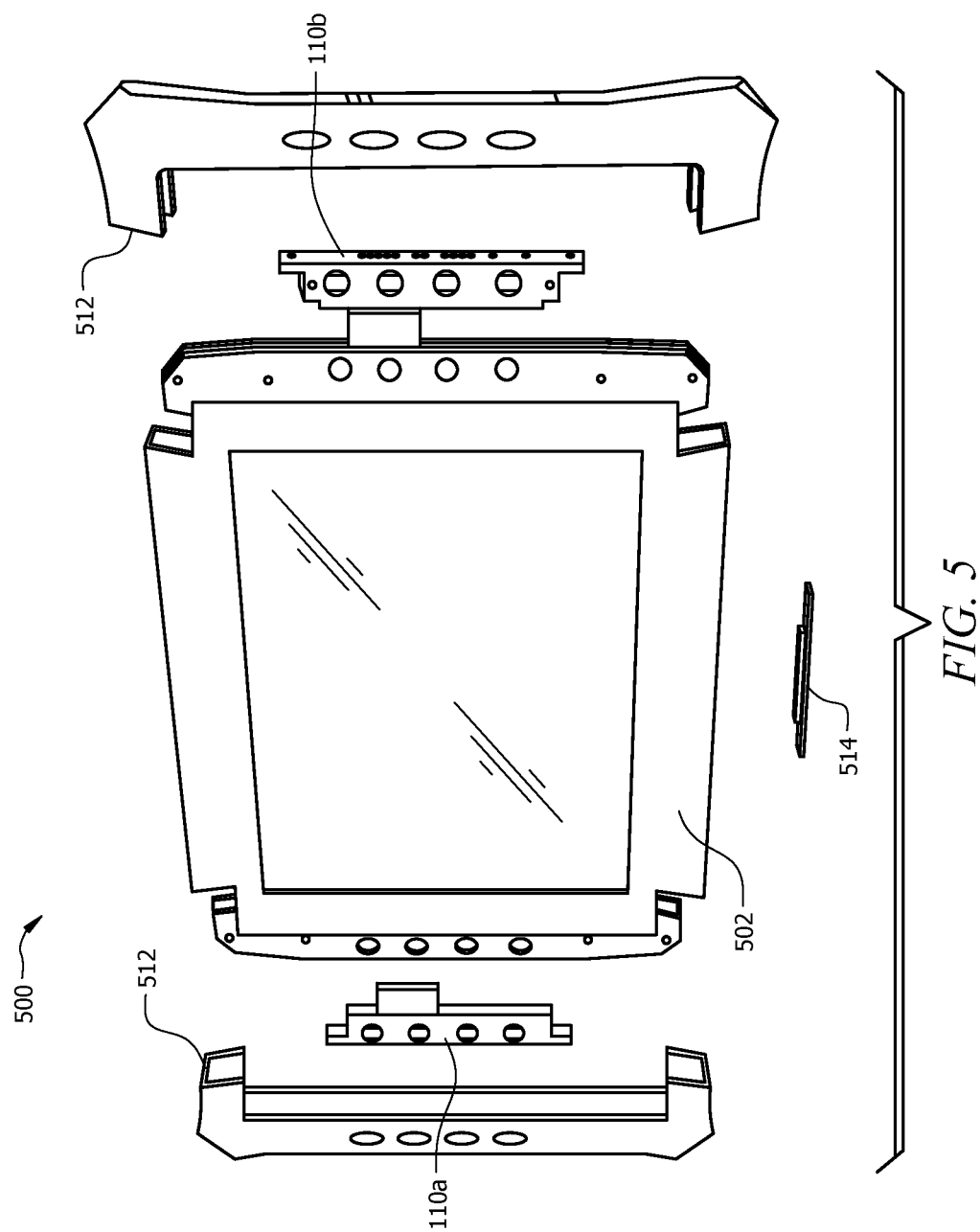
FIG. 5 is a front exploded view of an embodiment of a housing.
Figure 6:
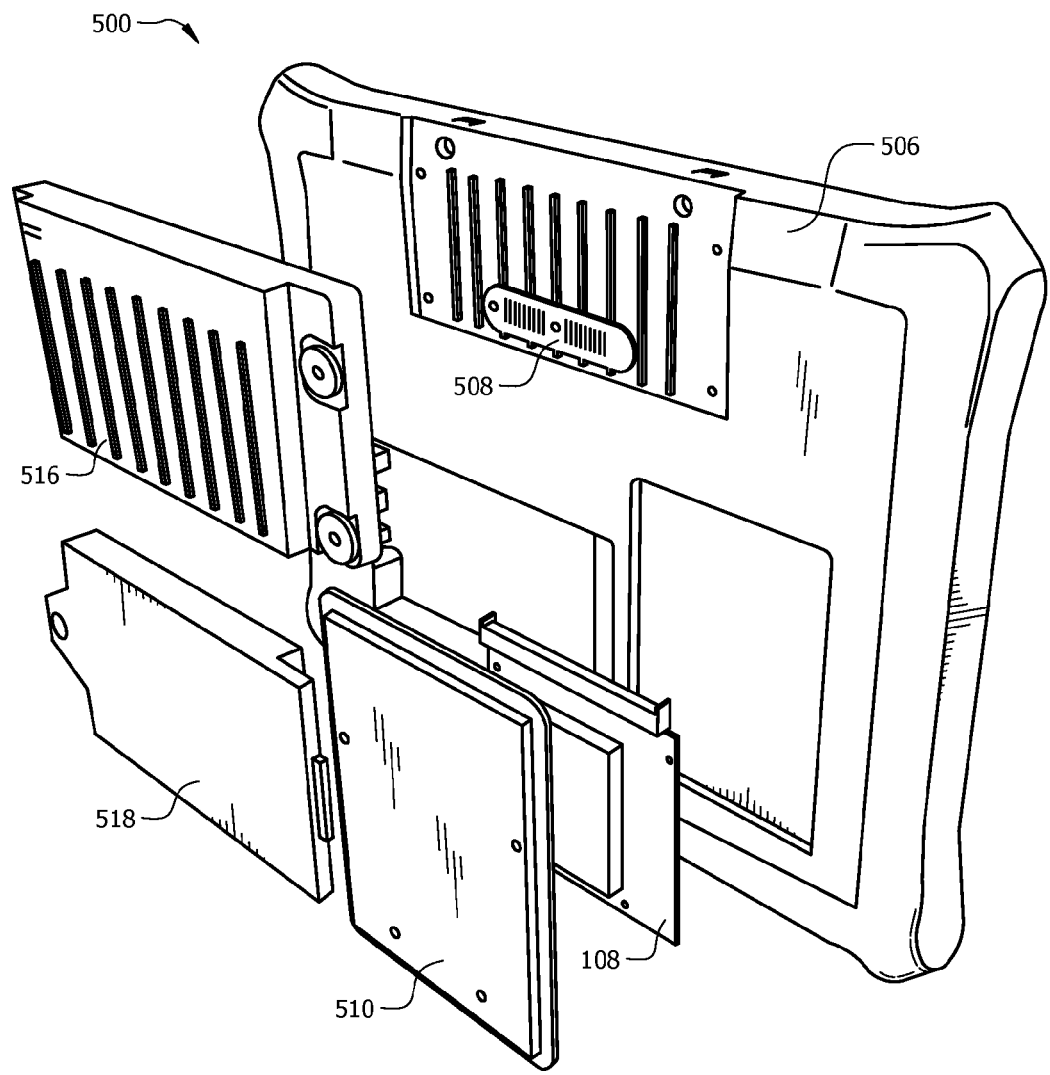
FIG. 6 is a rear exploded view of an embodiment of a housing.

Referring to FIGS. 4-6, the RMCD 100 may be disposed within a housing or an enclosure 500 which may be configured to protect the RMCD 100. Additionally, the housing 500 may provide a means for transporting the RMCD 100 and/or for integrating the RMCD 100 with other structures or devices. For example, the housing 500 may be configured to be mounted on and/or integrated with, for example, a wall mount, a flush mount, a desktop mount, a stand, a mobile dock, a docking station (e.g., via a docking connector 514), a bumper guard 512, or the like.

In an embodiment, the housing may be made of two or more operably connected components (e.g., a front case 502, a mid-frame 504, and a back case 506). For example, RMCD 100 may be coupled to the mid-frame 504 (e.g., via the PCB 102) and enclosed by the front case 502 and the back case 506. Alternatively, the housing may comprise any suitable enclosure structure as will be appreciated by one of ordinary skill in the art with the aid of this disclosure. Further, the housing may comprise one or more mounting surfaces, recesses, and/or openings, for example, for the purpose of mounting one or more components of the RMCD 100 (e.g., the PCB 102, one or more peripherals 110, etc.). For example, in the embodiment of FIG. 5, the housing 500 may be configured to mount or support a user interface module 110a and an I/O module 110b. The housing 500 may be configured to integrate one or more add-on or expansion modules (e.g., a battery pack 518, a heat spreader 510, etc.). For example, in the embodiment of FIG. 6, an expansion module 516 may be integrated with the housing 500 and RMCD 100 via an expansion connector 508. As such, the housing may be made of conventional materials and methods as would be appreciated by one of ordinary skill in the art.

In an embodiment, the RMCD 100 may further comprise one or more thermal provisions. For example, the RMCD 100 may comprise one or more passive thermal provision (e.g., a heat spreader, a heat sink, a heat pipe, a vent, etc.) and/or one or more active thermal provisions (e.g., a fan, a forced air system, a hydraulic system, a cryogenic cooling system, etc.). In such an embodiment, the thermal provisions may extend the operating temperature range (e.g., allowing a higher operating temperature and/or a lower operating temperature) beyond that which is achievable without such thermal provisions. For example, the RMCD 100 may comprise a forced air system (e.g., an electric fan) in electrical signal communication with the first microcontroller 104 and/or the second microcontroller 106 and may be configured to be controlled and/or operated by the first microcontroller 104 and/or the second microcontroller 106.

Figure 7:
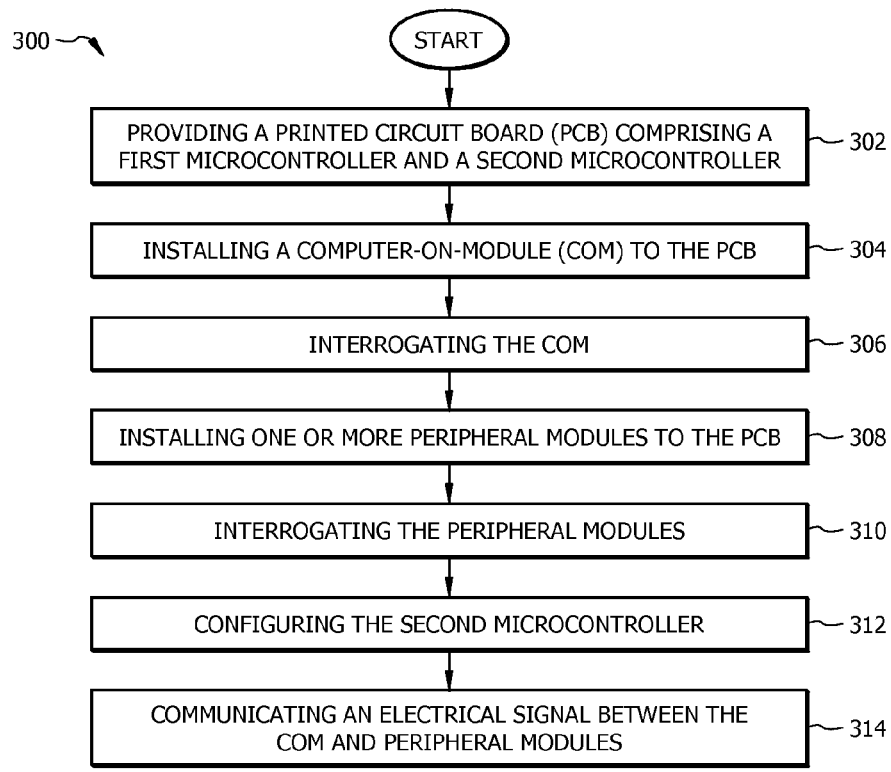
FIG. 7 is a flowchart of an embodiment of a computing device configuring method.

In an embodiment, a method of configuring a computing device utilizing a RMCD is disclosed herein. As illustrated in FIG. 7, a computing device configuring method 300 may generally comprise the steps of providing a PCB (e.g., the MLB of FIG. 3) comprising a first microcontroller (e.g., the PIC of MLB of FIG. 3) and a second microcontroller (e.g., the ODEM module of FIG. 3) 302, coupling a COM (e.g., the COM of FIG. 3) to the PCB 304, interrogating the COM 306, coupling one or more peripheral modules (e.g., UI module and I/O module of FIG. 3) to the PCB 308, interrogating the peripheral modules 310, configuring the second microcontroller 312, and communicating an electrical signal between the COM and the peripheral modules via the second microcontroller 314.

Optionally, the computing device configuring method 300 may further comprise decoupling the COM from the PCB 102, coupling a second COM to the PCB 102, interrogating the second COM, configuring the second microcontroller 106, and communicating an electrical signal between the second COM and the peripheral modules 110. Additionally or alternative, the computing device configuring method 300 may further comprise reconfiguring the peripheral modules 110, interrogating the peripheral modules 110, configuring the second microcontroller 106, and communicating an electrical signal between the COM and the peripheral modules 110. Additionally or alternatively, the computing device configuring method 300 may further comprise providing a docking station, interrogating the docking station, configuring the second microcontroller 106, and communicating an electrical signal between the COM and the docking station.

Figure 8:
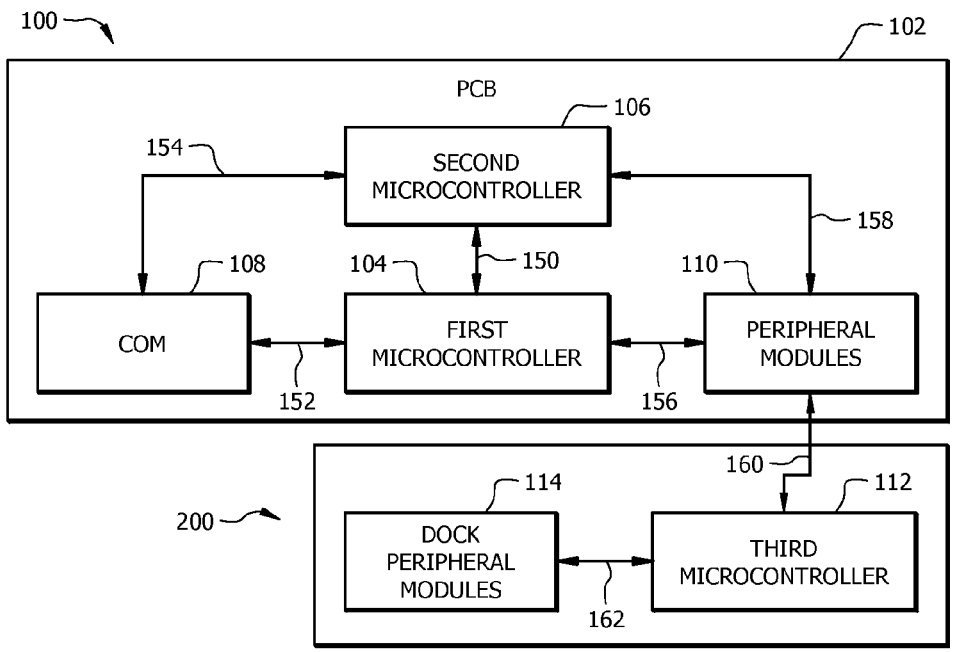
FIG. 8 is a schematic diagram of an embodiment of a configurable computing device and a docking station.

Referring to FIG. 8, the PCB 102 may be provided comprising the first microcontroller 104 and the second microcontroller 106. For example, the PCB 102 may be coupled to and/or disposed within the housing 500, for example, the PCB 102 is mounted to a mid-frame 504 within the housing 500, as shown in FIG. 4. In an embodiment, the first microcontroller 104 and/or the second microcontroller 106 may be installed onto the PCB 102, for example, following mounting the PCB 102 to the housing 500. For example, where the second microcontroller 106 is coupled to a carrier board (e.g., a PCB have a plurality of electrical contacts), the second microcontroller 106 may be installed into a suitable receiver port (e.g., a peripheral connection bus) on the PCB 102. Alternatively, the first microcontroller 104 and/or the second microcontroller 106 may be hard-wired (e.g., soldered) to a plurality of electrical traces on the PCB 102. Additionally, when providing the PCB 102 comprising the first microcontroller 104 and the second microcontroller 106, the first microcontroller 104 and/or the second microcontroller 106 may be programmed or reprogrammed with data and/or device setting configurations, for example, to provide a default device configuration and/or logical operations. For example, one or more I/O ports may be configured, a firmware may be installed, a driver may be installed, a BIOS may be configured, and/or any other suitable configuration operation may be performed as would be appreciated by one of ordinary skill in the art upon viewing this disclosure.

In an embodiment, a COM 108 may be provided and installed or coupled onto the PCB 102. For example, the COM 108 may be determined and/or configured for a desired application, for example, the COM 108 may comprise a preset operating system, CPU, chipset, etc. Where the COM 108 comprises a carrier board (e.g., a PCB have a plurality of electrical contacts), the COM 108 may be installed into a suitable receiver port (e.g., a peripheral connection bus) on the PCB 102, thereby providing a route of electrical signal communication between the COM 108 and the first microcontroller 104 and the COM 108 and the second microcontroller 106.

In an embodiment, following the coupling of the COM 108 to the PCB 102, the first microcontroller 104 and/or the second microcontroller 106 may interrogate the COM 108, for example, via the I/O ports (e.g., I$^2$C, LPC, UART, etc.) and employing any suitable protocol and/or method as would be appreciated by one of ordinary skill in the art upon viewing this disclosure. For example, the first microcontroller 104 and/or the second microcontroller 106 may employ a hardware detection protocol (e.g., a plug-and-play protocol) to detect the presence of the COM 108, for example, via an OS, a firmware, a driver, or data instructions programmed onto the first microcontroller 104 and/or the second microcontroller 106. Additionally, upon detecting the presence of the COM 108, the first microcontroller 104 and/or the second microcontroller 106 may generate or determine a COM profile. The COM profile may generally comprise device information, device configuration parameters, and/or device settings, etc. based on the detected COM 108. For example, the COM profile may comprise CPU information (e.g., Intel Atom E780T, Freescale iMX6, etc.), chip set information, clock speed information, OS information, manufacturing information, security key encryption, or any other suitable information for distinguishing and/or describing a COM as would be appreciated by one of ordinary skill in the art upon viewing this disclosure.

In an embodiment, one or more peripheral modules 110 may be provided and installed or coupled onto the PCB 102. For example, the peripheral modules 110 may be determined and/or configured for a desired application. For example, the peripheral modules 110 may comprise one or more user interface modules (e.g., a display, a keypad, a touchscreen, etc.), one or more I/O modules (e.g., a HDMI module, a USB module, a VGA module, etc.), and/or any other suitable module as would be appreciated by one of ordinary skill in the art upon viewing this disclosure. The peripheral modules 110 may be installed into a suitable receiver port (e.g., a peripheral connection bus) on the PCB 102, thereby providing a route of electrical signal communication between the peripheral modules 110 and the first microcontroller 104 and the peripheral modules 110 and the second microcontroller 106.

In an embodiment, following the coupling of the peripheral modules 110 to the PCB 102, the first microcontroller 104 and/or the second microcontroller 106 may interrogate each of the peripheral modules 110. For example, the first microcontroller 104 and/or the second microcontroller 106 may employ a hardware detection protocol (e.g., a plug-and-play protocol) to detect the presence of each peripheral module 110, for example, via an OS, a firmware, a driver, or data instructions programmed onto the first microcontroller 104 and/or the second microcontroller 106. Additionally, upon detecting the presence of the peripheral modules 110, the first microcontroller 104 and/or the second microcontroller 106 may generate or determine a peripheral module profile. The peripheral module profile may generally comprise device information, device configuration parameters, and/or device settings, etc. based on the detected peripheral modules 110.

In an embodiment, the second microcontroller 106 may provide one or more electrical signal flow paths in response to the COM profile and/or the peripheral module profile. For example, one or more I/O ports of the second microcontroller 106 may be configured and/or reconfigured dependent on the COM 108 and/or the peripheral modules 110 coupled to the PCB 102 (e.g., based on the COM profile and/or the peripheral module profile), thereby allowing and/or disallowing one or more electrical signal flow paths between the COM 108 and the peripheral modules 110 via the second microcontroller 106.

In an embodiment, the second microcontroller 106 comprises a memory having a look-up table relating a plurality of predefined I/O port configurations with a particular device (e.g., a COM, a peripheral module, etc.). For example, following detecting a device coupled to the PCB 102, the second microcontroller 106 may determine the profile of the device (e.g., via the COM profile, the peripheral module profile, etc.) and may employ a predefined I/O port configuration associated with the detected device, thereby routing an electrical signal flow path and enabling electrical signal communication to the device via the second microcontroller 106. In an additional or alternative embodiment, the second microcontroller 106 may comprise and/or is coupled to a plurality of electronically switchable gates (e.g., a matrix switch, a gate array, etc.) and implement predefined switch configurations associated with the detected device, thereby routing an electrical signal flow path and enabling electrical signal communication to the device via the second microcontroller 106. Additionally, the second microcontroller 106 may determine (e.g., via the COM profile, the peripheral module profile, etc.) and allow the appropriate protocols and/or signaling to be performed based on the detected device. Alternatively, any suitable passive or active methods or techniques may be employed to configure the I/O ports of the second microcontroller 106 in response to a particular device, as would be appreciated by one of ordinary skill in the art upon viewing this disclosure.

In an embodiment, upon establishing one or more electrical signal flow paths via the second microcontroller 106, the COM 108 may communicate an electrical signal (e.g., a data signal) to/from the peripheral modules 110 via the electrical signal flow paths enabled by the second microcontroller 106. For example, the peripheral modules 110 may comprise a display (e.g., a LCD screen, a LED screen, etc.) and the COM 108 may display graphical data on the display. Additionally or alternatively, the peripheral modules 110 may comprise a plurality of I/O port modules (e.g., a USB module, an HDMI module, etc.) and the COM 108 may transfer data to/from the I/O port modules via the electrical signal flow paths enabled by the second microcontroller 106. Additionally or alternatively, the peripheral modules 110 may comprise a user interface module (e.g., a keypad, a touch screen, etc.) and the COM 108 may receive commands from a user via the user interface module via the electrical signal flow paths enabled by the second microcontroller 106. Additionally or alternatively, the peripheral modules 110 may comprise a sensor module (e.g., a camera, a RFID module, etc.) and the COM 108 may receiver sensor data from the sensor module via the electrical signal flow paths enabled by the second microcontroller 106. Additionally or alternatively, the peripheral modules 110 may comprise a communications module (e.g., a WiFi module, a cellular radio module, etc.) and the COM 108 may transmit and receive data via the communications module via the electrical signal flow paths enabled by the second microcontroller 106. Additionally or alternatively, the COM 108 may employ or communicate with any other suitable peripheral module 110 via the electrical signal flow paths enabled by the second microcontroller 106, as would be appreciated by one of ordinary skill in the art upon viewing this disclosure.

In an embodiment, the RMCD 100 may be reconfigured and the COM 108 may be replaced and/or removed from the PCB 102. For example, the COM 108 may be decoupled from the PCB 102, for example, via removing the COM 108 from a peripheral connection bus on the PCB 102. A second COM may be provided and installed onto or coupled to the PCB 102, for example, using the same connection and footprint as the COM 108. The second COM may be determined and/or configured (e.g., a preset operating system, CPU, chipset, etc.) for a desired application. In an embodiment, the second COM is different from the COM 108 (e.g., a change from a x86 COM platform to an ARM COM platform). In an alternative embodiment, the second COM is a new or updated version of the COM 108 (e.g., an x86 or ARM COM platform update, for example, an updated CPU, chip set, etc.).

The second COM may be installed into a suitable receiver port (e.g., a peripheral connection bus) on the PCB 102. The first microcontroller 104 and/or the second microcontroller 106 may interrogate the second COM to generate or determine a COM profile based on the second COM, similar to previously disclosed. Additionally, one or more I/O ports of the second microcontroller 106 may be configured and/or reconfigured dependent on the second COM coupled to the PCB 102 (e.g., based on the COM profile), thereby allowing and/or disallowing one or more electrical signal flow paths between the second COM and the peripheral modules 100 via the second microcontroller 106. Upon establishing one or more electrical signal flow paths via the second microcontroller 106, the second COM may communicate an electrical signal (e.g., a data signal) to/from the peripheral modules 110 via the electrical signal flow paths enabled by the second microcontroller 106.

In an embodiment, the RMCD 100 may be reconfigured and one or more peripheral modules may be replaced and/or removed from the PCB 102. For example, one or more peripheral modules (e.g., the UI module 110a and/or the I/O module 110b of FIG. 3) may be decoupled from the PCB 102, for example, via removing the peripheral module from a peripheral connection bus on the PCB 102. In an embodiment, one or more additional and/or different peripheral modules may be provided and installed or coupled onto the PCB 102. The peripheral modules may be determined and/or configured for a desired application. The first microcontroller 104 and/or the second microcontroller 106 may interrogate the peripheral modules to generate or determine a peripheral module profile based on the peripheral modules coupled to the PCB 102, similar to previously disclosed. Additionally, one or more I/O ports of the second microcontroller 106 may be configured and/or reconfigured dependent on the peripheral modules coupled to the PCB 102 (e.g., based on the peripheral module profile), thereby allowing and/or disallowing one or more electrical signal flow paths between the COM 108 and the peripheral modules via the second microcontroller 106. Upon establishing one or more electrical signal flow paths via the second microcontroller 106, the COM 108 may communicate an electrical signal (e.g., a data signal) to/from the peripheral modules via the electrical signal flow paths enabled by the second microcontroller 106.

In an embodiment, the RMCD 100 may be coupled to or integrated with a docking station 200. For example, in the embodiment of FIG. 8, the docking station 200 may comprise a third microcontroller 112 in electrical signal communication with one or more dock peripheral modules 114 (e.g., one or more user interface modules, one or more I/O modules, etc.), for example, via electrical connection 162. The RMCD 100 may be physically and/or electrically coupled to the docking station 200, for example, the housing of the RMCD 100 may be supported by the docking station 200 and the RMCD 100 may be in electrical signal communication with the docking station 200 via an electrical connection 160. The first microcontroller 104 and/or the second microcontroller 106 may interrogate the docking station 200 (e.g., the third microcontroller 112 and/or the dock peripherals 114) to generate or determine a docking station profile based on the docking station 200, similar to previously disclosed. Additionally, in an embodiment, one or more I/O ports of the second microcontroller 106 may be configured and/or reconfigured dependent on the docking station 200 coupled to the RMCD 100 (e.g., based on the docking station profile), thereby allowing and/or disallowing one or more electrical signal flow paths between the COM 108 and the docking station 200 (e.g., the third microcontroller 112, the dock peripherals 114, etc.) via the second microcontroller 106. Upon establishing one or more electrical signal flow paths via the second microcontroller 106, the COM 108 may communicate an electrical signal (e.g., a data signal) to/from the docking station 200 via the electrical signal flow paths enabled by the second microcontroller 106.

Figure 9:
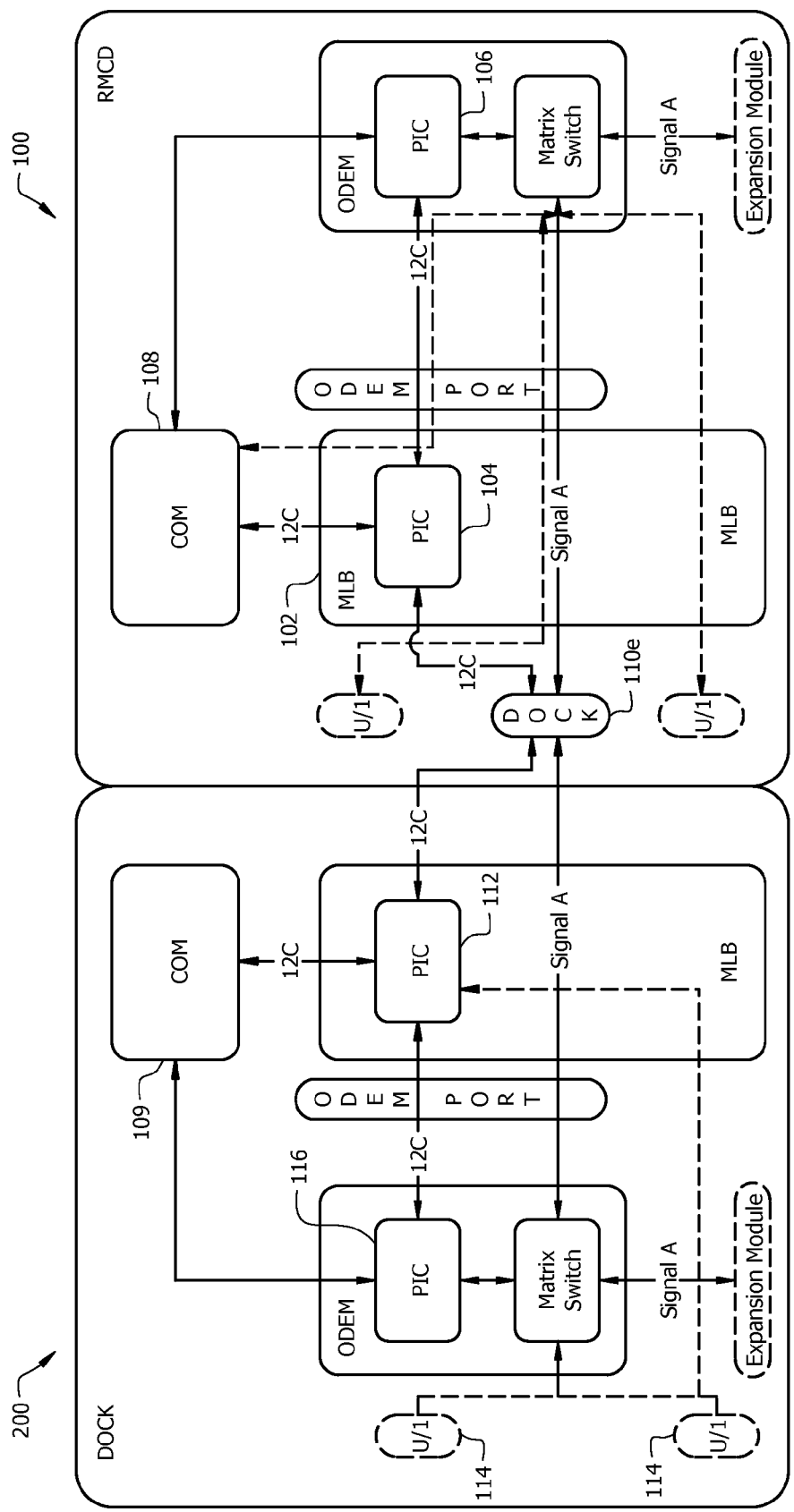
FIG. 9 is a schematic diagram of another embodiment of a configurable computing device and a docking station.

In an alternative embodiment, as shown in FIG. 9, the docking station 200 may comprise the third microcontroller 112 in electrical signal communication with a docking station COM 109, a fourth microcontroller 116, and one or more dock peripheral modules 114 (e.g., one or more user interface modules, one or more I/O modules, etc.). The fourth microcontroller may be in electrical signal communication with the docking station COM 109 and the dock peripheral modules 114. In such an embodiment, the RMCD 100 may be physically and/or electrically coupled to the docking station 200, for example, the housing of the RMCD 100 may be supported by the docking station 200 and the RMCD 100 may be in electrical signal communication with the docking station 200 via a docking module 110e. The first microcontroller 104 and/or the second microcontroller 106 may interrogate the docking station 200 (e.g., the third microcontroller 112, the fourth microcontroller 116, the docking station COM 109, and/or the dock peripherals 114) to generate or determine a docking station profile based on the docking station 200, similar to previously disclosed. In the embodiment of FIG. 9, the second microcontroller 106 comprises a matrix switch and may configure and/or reconfigure one or more electrical signal flow paths (e.g., via switching one or more electronically switchable gates), thereby allowing and/or disallowing one or more electrical signal flow paths between the COM 108 and the docking station 200 (e.g., the third microcontroller 112, the fourth microcontroller 116, the docking station COM 109, the dock peripherals 114, etc.) via the second microcontroller 106. Additionally or alternatively, one or more I/O ports of the second microcontroller 106 may be configured and/or reconfigured one or more electrical signal flow paths dependent on the docking station 200 coupled to the RMCD 100 (e.g., based on the docking station profile), thereby allowing and/or disallowing one or more electrical signal flow paths between the COM 108 and the docking station 200 (e.g., the third microcontroller 112, the fourth microcontroller 116, the docking station COM 109, the dock peripherals 114, etc.) via the second microcontroller 106. Upon establishing one or more electrical signal flow paths via the second microcontroller 106, the COM 108 may communicate an electrical signal (e.g., a data signal) to/from the docking station 200 via the electrical signal flow paths enabled by the second microcontroller 106.

In an embodiment, a computing device, such as the RMCD 100, a computing system comprising a RMCD, such as RMCD 100, a computing device configuring method employing such a computing device, such as RMCD 100, or combinations thereof may be advantageously employed to allow manufacturer, a reseller, or an end-user to configure and/or reconfigure the RMCD for one or more applications, as needed. In an embodiment, as previously disclosed, a RMCD allows a user to configure the RMCD for a first application (e.g., comprising a first set of a COM, peripheral modules, etc.) and then reconfigure the RMCD for one or more subsequent applications (e.g., comprising a second set of a COM, peripheral modules, etc.). Conventional computing device may be limited and/or unable to support a broad range of applications, COMs, and/or peripheral modules. As such, the RMDC may be suitably employed in a variety of applications and may support a variety of COMs and peripheral modules using a common platform. Additionally, such an RMDC may reduce cost, which may be typically unachievable for similar low volume custom devices.

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of this disclosure. Accordingly, the foregoing detailed description is to be clearly understood as being given by way of illustration and example only, the spirit and scope of the invention being limited solely by the appended claims and their equivalents.

ADDITIONAL DISCLOSURE

The following are non-limiting, specific embodiments in accordance with the present disclosure:

A first embodiment, which is a configurable computing device comprising:
a housing;
a printed circuit board (PCB) disposed within the housing;
a first microcontroller and a second microcontroller each coupled to the PCB, wherein the first microcontroller and the second microcontroller are in electrical signal communication with each other;
a computer-on-module (COM) coupled to the PCB, wherein the COM is in electrical signal communication with the first microcontroller and the second microcontroller; and
one or more peripheral modules coupled to the PCB,
wherein, the peripheral modules are each in electrical signal communication with the first microcontroller; and
wherein, the peripheral modules are each in electrical signal communication with the COM via the second microcontroller.

A second embodiment, which is the configurable computing device of the first embodiment, wherein the second microcontroller comprises a plurality of programmable input/output ports.

A third embodiment, which is the configurable computing device of any one of the first embodiment through the second embodiment, wherein the second microcontroller is in electrical signal communication with a plurality of electronic switches.

A fourth embodiment, which is the configurable computing device of any one of the first embodiment through the third embodiment, wherein the COM is an x86 platform or an ARM platform.

A fifth embodiment, which is the configurable computing device of any one of the first embodiment through the fourth embodiment, wherein the peripheral modules comprises a user interface (UI) module.

A sixth embodiment, which is the configurable computing device of any one of the first embodiment through the fifth embodiment, wherein the peripheral modules comprises an input output (IO) module.

A seventh embodiment, which is the configurable computing device of any one of the first embodiment through the sixth embodiment, wherein the peripheral modules comprises a display screen.

An eighth embodiment, which is the configurable computing device of any one of the first embodiment through the seventh embodiment, wherein the peripheral modules comprise a touch screen.

A ninth embodiment, which is the configurable computing device of any one of the first embodiment through the eighth embodiment, wherein the device is configured to be handheld.

A tenth embodiment, which is the configurable computing device of any one of the first embodiment through the ninth embodiment, wherein the peripheral module comprises a docking module.

An eleventh embodiment, which is the configurable computing device of any one of the first embodiment through the tenth embodiment, further comprising one or more thermal provisions.

A twelfth embodiment, which is a computing device configuring method comprising the steps of:
providing a printed circuit board (PCB) comprising a first microcontroller and a second microcontroller, wherein the first microcontroller and the second microcontroller are in electrical signal communication with each other;

installing a computer-on-module (COM) to the PCB, wherein the COM is electrically coupled to the PCB;

interrogating the COM, thereby determining a COM profile;

installing one or more peripheral modules to the PCB, wherein the peripherals are each electrically coupled to the PCB;

interrogating the peripheral modules, thereby determining a peripheral module profile;

configuring the second microcontroller,
wherein, the second microcontroller is configured dependent on the COM profile and the peripheral module profile and provides one or more electrical signal flow paths between the COM and the peripheral modules; and communicating an electrical signal between the COM and the peripheral modules via the second microcontroller.

A thirteenth embodiment, which is the computing device configuring method of the twelfth embodiment, wherein interrogating the COM is performed by the first microcontroller.

A fourteenth embodiment, which is the computing device configuring method of any one of the twelfth embodiment through the thirteenth embodiment, wherein interrogating the one or more peripheral modules is performed by the first microcontroller.

A fifteenth embodiment, which is the computing device configuring method of any one of the twelfth embodiment through the fourteenth embodiment, further comprising the steps of:

removing the COM from the PCB;
installing a second COM to the PCB;
interrogating the second COM; and
configuring the second microcontroller, wherein the second microcontroller provides one or more electrical signal flow path between the second COM and the one or more peripheral modules;
communicating an electrical signal between the second COM and the one or more peripheral modules via the second microcontroller.

A sixteenth embodiment, which is the computing device configuring method of any one of the twelfth embodiment through the fifteenth embodiment, further comprising the steps of:

reconfiguring the peripheral modules coupled to the PCB;
interrogating the reconfigured peripheral modules;
installing the second microcontroller, wherein the second microcontroller provides one or more electrical signal flow path between the COM and the peripheral modules; and
communicating an electrical signal between the COM and the peripheral modules via the second microcontroller.

A seventeenth embodiment, which is the computing device configuring method of any one of the twelfth embodiment through the sixteenth embodiment, further comprising the steps of:

providing a docking station comprising one or more dock microcontrollers in electrical signal communication with one or more dock peripheral modules, wherein the peripheral modules are in electrical signal communication with the dock microcontrollers;
interrogating the docking station;
configuring the second microcontroller, wherein the second microcontroller provides one or more electrical signal flow path between the COM and the dock peripheral modules; and communicating an electrical signal between the COM and the dock peripheral modules via the second microcontroller.

An eighteenth embodiment, which is the computing device configuring method of any one of the twelfth embodiment through the sixteenth embodiment, further comprising the steps of:

providing a docking station comprising one or more dock microcontrollers in electrical signal communication with one or more dock peripheral modules, wherein the peripheral modules are in electrical signal communication with the dock microcontrollers;
interrogating the docking station;
configuring the second microcontroller, wherein the second microcontroller provides one or more electrical signal flow path between the COM and the dock station COM; and
communicating an electrical signal between the COM and the docking station COM via the second microcontroller.

A nineteenth embodiment, which is a mobile computing device comprising:

a housing comprising a front case, a mid-frame, and a back case, wherein the front case and the back case are configured to combine and enclose the mid-frame;
a printed circuit board (PCB) coupled to the mid-frame;
a first microcontroller and a second microcontroller each coupled to the PCB, wherein the first microcontroller and the second microcontroller are in electrical signal communication with each other;
a computer-on-module (COM) coupled to the PCB, wherein the COM is in electrical signal communication with the first microcontroller and the second microcontroller; and
one or more peripheral modules coupled to the PCB,
wherein the peripheral modules are each in electrical signal communication with the first microcontroller;
wherein the peripheral modules are each in electrical signal communication with the COM via the second microcontroller; and
wherein the peripheral modules comprises a display, one or more input/output (I/O) ports, a dock module, and one or more user interfaces.

A twentieth embodiment, which is the mobile computing device of the nineteenth embodiment, further comprising one or more thermal provision.

While embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=Rl+k*(Ru-Rl)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Detailed Description of the Embodiments is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A configurable computing device comprising:
   a housing;
   a printed circuit board (PCB) disposed within the housing;
   a computer-on-module (COM) removably coupled to the PCB and in electrical signal communication with a first microcontroller and a second microcontroller, wherein the COM is configured to execute an instruction set and an operating system;
   one or more peripheral modules coupled to the PCB and in electrical signal communication with the first microcontroller and the second microcontroller;
   the first microcontroller coupled to the PCB,
      wherein the first microcontroller is configured to:
         interrogate the COM and the peripheral modules, wherein interrogating the COM and the peripheral modules comprises employing a hardware detection protocol;
         provide a COM profile to the second microcontroller that comprises at least one of a central processing unit (CPU) information or the operating system for the COM in response to interrogating the COM, and
         provide a peripheral module profile to the second microcontroller that comprises at least one of a device identifier or a driver information for the peripheral modules in response to interrogating the peripheral modules; and
   the second microcontroller coupled to the PCB and in electrical signal communication with the first microcontroller,
      wherein the second microcontroller is configured to:
         determine an input/output (I/O) port configuration for the second microcontroller that provides a route of electrical signal communication between the COM and the peripheral modules based on the COM profile and the peripheral module profile; and
         establish the route of electrical signal communication between the COM and the peripheral modules via the second microcontroller.

2. The device of claim 1, wherein the COM profile identifies a chipset.

3. The device of claim 1, wherein the second microcontroller is configured to implement one or more signaling protocols between the COM and the peripheral modules to establish the route of electrical signal communication between the COM and the peripheral modules.

4. The device of claim 1, wherein one or more of the peripheral modules are removably coupled to the PCB.

5. The device of claim 1, wherein the second microcontroller comprises a plurality of programmable I/O ports, and wherein the second microcontroller is configured to associate the COM profile and the peripheral module profile to the I/O port configuration.

6. The device of claim 1, wherein the second microcontroller comprises a plurality of electronically switchable gates, wherein the second microcontroller is configured to associate the COM profile and the peripheral module profile to one or more gate configurations for the plurality of electronically switchable gates, and wherein establishing the route of electrical signal communication between the COM and the peripheral modules comprises actuating the plurality of electronically switchable gates using the one or more gate configurations.

7. The device of claim 1, wherein the COM is an x86 platform or an ARM platform.

8. The device of claim 1, wherein one or more of the peripheral modules are a user interface (UI) module.

9. The device of claim 1, wherein the device is configured to:
   couple to a docking station comprising one or more docking peripheral modules;
   interrogate the docking stating using a hardware detection protocol;
   generate a docking station profile that comprises at least one of a device configuration parameter or a device setting; and
   establish a route of electrical signal communication between the COM and the docking station using the docking station profile.

10. A device configuring method comprising:
   receiving device information from a computer-on-module (COM) at a first microcontroller, wherein receiving device information from the COM comprises using a hardware detection protocol, and wherein the COM is configured to execute an instruction set and an operating system;
   providing a COM profile that comprises at least one of a central processing unit (CPU) information or the operating system for the COM to a second microcontroller in response to receiving the device information from the COM;
   receiving device information from a peripheral module at the first microcontroller, wherein receiving device information from the peripheral module comprises using a hardware detection protocol;
   providing a peripheral module profile that comprises at least one of a device identifier or a driver information for the peripheral module to the second microcontroller in response to receiving the device information from the peripheral module;
   sending the COM profile and the peripheral module profile to the second microcontroller, wherein the second microcontroller is configured to:
   determine an input/output (I/O) port configuration for the second microcontroller that provides a route of electrical communication between the COM and the peripheral module based on the COM profile and the peripheral module; and establish the route of electrical signal communication between the COM and the peripheral module using the I/O port configuration.

11. The method of claim 10, wherein the COM profile identifies a a chipset.

12. The method of claim 10, wherein the peripheral module profile identifies a peripheral module type.

13. The method of claim 10, wherein the peripheral module profile identifies a signaling protocol associated with the peripheral module.

14. The method of claim 13, wherein the second microcontroller implements the signaling protocol to establish the route of electrical signal communication between the COM and the peripheral modules.

15. The method of claim 10, wherein establishing the route of electrical signal communication between the COM and peripheral module comprises actuating a plurality of electronically switchable gates.

16. The method of claim 10, further comprising:
generating a second COM profile in response to detecting a second COM; and
sending the second COM profile to the second microcontroller, wherein the second microcontroller establishes a route of electrical signal communication between the second COM and the peripheral module via the second microcontroller based on the second COM profile.

17. The method of claim 10, further comprising:
generating a second peripheral module profile in response to detecting a second peripheral module; and
sending the second peripheral module profile to the second microcontroller, wherein the second microcontroller establishes a route of electrical signal communication between the COM and the second peripheral module via the second microcontroller based on the second peripheral module profile.

18. The method of claim 10, further comprising:
receiving device information from a docking station at the first microcontroller, wherein the device information from the docking station identifies a docking peripheral module;
providing a docking station profile in response to receiving the device information from the docking station, wherein the docking station profile comprises at least one of a device configuration parameter or a device setting; and
sending the docking station profile to the second microcontroller, wherein the second microcontroller establishes a route of electrical signal communication between the COM and the docking peripheral module via the second microcontroller based on the docking station profile.

19. The device of claim 1, wherein the COM comprises:
a CPU; and
a memory coupled to the CPU, wherein the memory comprises computer executable instructions stored in a non-transitory computer readable medium such that, when executed by the CPU, causes the CPU to execute the instruction set or the operating system.

20. The method of claim 10, wherein the second microcontroller is further configured to associate the COM profile and the peripheral module profile to a plurality of I/O port configurations for the second microcontroller.

* * * * *

UNITED STATES PATENT AND TRADEMARK OFFICE
CERTIFICATE OF CORRECTION

PATENT NO. : 8,924,609 B2  
APPLICATION NO. : 14/263742  
DATED : December 30, 2014  
INVENTOR(S) : Douglas Lee Fowler It is certified that error appears in the above-identified patent and that said Letters Patent is hereby corrected as shown below:

In the Claims,

Column 18, Line 31, replace "docking stating" with --docking station--.

Signed and Sealed this
Thirty-first Day of March, 2015

Michelle K. Lee
*Director of the United States Patent and Trademark Office*